United States Patent [19]

Thomas

[11] Patent Number: 4,832,496
[45] Date of Patent: May 23, 1989

[54] METHOD AND APPARATUS FOR MEASURING THE MONOCRYSTAL DIAMETER AND THE MELT LEVEL DURING CRUCIBLE DRAWING IN THE CZOCHRALSKI PROCESS

[75] Inventor: Friedrich W. Thomas, Gelnhausen, Fed. Rep. of Germany

[73] Assignee: Leybold-Heraeus GmbH, Cologne, Fed. Rep. of Germany

[21] Appl. No.: 925,485

[22] Filed: Oct. 29, 1986

Related U.S. Application Data

[63] Continuation of Ser. No. 724,493, Apr. 18, 1985, abandoned, Ser. No. 535,546, Sep. 26, 1983, abandoned, Ser. No. 414,988, Sep. 3, 1982, abandoned, and Ser. No. 156,540, Jun. 5, 1980, abandoned.

[30] Foreign Application Priority Data

Jun. 8, 1979 [DE] Fed. Rep. of Germany ....... 2923240

[51] Int. Cl.$^4$ ............................................. G01B 11/10
[52] U.S. Cl. ..................................... 356/384; 356/72; 356/375
[58] Field of Search ............... 356/384, 385, 386, 387, 356/72, 73, 375; 73/291, 293

[56] References Cited

U.S. PATENT DOCUMENTS

| | | | |
|---|---|---|---|
| 3,493,770 | 2/1970 | Dessauer et al. | 250/222 |
| 3,718,757 | 2/1973 | Gulitz et al. | 156/601 |
| 3,812,483 | 5/1974 | Graves | 358/113 |
| 3,886,359 | 5/1975 | Cheek et al. | 358/113 |
| 3,958,129 | 5/1976 | Clement et al. | 250/574 |
| 4,112,469 | 9/1978 | Paranjpe et al. | 358/293 |
| 4,188,544 | 2/1980 | Chasson | 356/376 |
| 4,207,293 | 6/1980 | Scholl et al. | 356/386 |
| 4,239,583 | 12/1980 | Hatch et al. | 156/617 SP |
| 4,242,589 | 12/1980 | Sachs | 356/387 |
| 4,290,835 | 9/1981 | Yates | 156/601 |

OTHER PUBLICATIONS

Simms, T., "The Application of CCD's to Document Scanning", *Microelectronics*, vol. 7, No. 2, (Dec. 1975) pp. 60–63.

Hull et al., "Monitoring Diameter of Semiconductor Crystals During Automated Growth", *IBM Technical Disclosure Bulletin*, vol. 19, No. 3 (Aug. 1976) pp. 869–870.

Corburn et al., "Monitoring Lateral Dimensions of Semiconductor Crystals During Automated Growth", *IBM Technical Disclosure Bulletin*, vol. 15, No. 4 (Sep. 1972) pp. 1334–1335.

O'Kane et al., "Infrared TV System of Computer Controlled Czochralski Crystal Growth", *Journal of Crystal Growth*, 13/14 (May 1972) pp. 624–628.

Gärtner et al., "An Electronic Device Including a TV--System for Controlling the Crystal Diameter During Czochrolski Growth", *Journal of Crystal Growth*, 13/14 (May 1972) pp. 619–623.

*Primary Examiner*—Richard A. Rosenberger
*Attorney, Agent, or Firm*—Felfe & Lynch

[57] ABSTRACT

A method and apparatus for measuring the diameter of a monocrystal during crucible drawing determines the brightness profile at the melt/monocrystal change-over point. The spacial position of maxima in the brightness profile in relation to a reference point indicates the diameter. The brightness profile is obtained by optically scanning the melt/monocrystal change-over point with a mirror rotating about a horizontal axis, applying the optical beam reflected by the rotating mirror to a row of photosensitive elements in parallel with the axis, and analyzing the outputs corresponding to the brightness profile for determining the diameter.

14 Claims, 2 Drawing Sheets

U.S. Patent  May 23, 1989  Sheet 1 of 2  4,832,496
FIG. 1
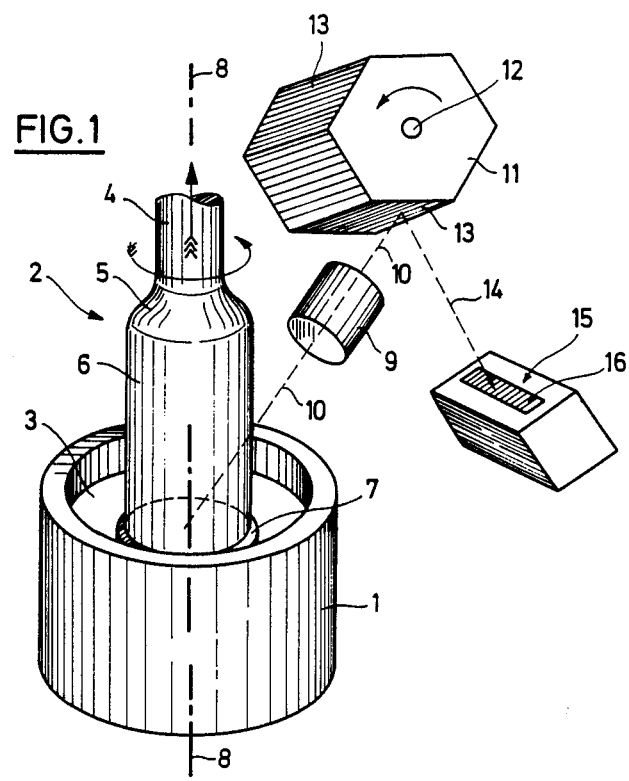
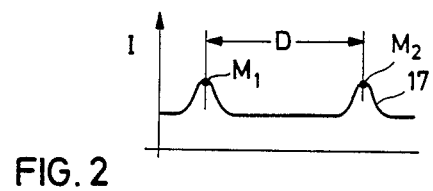
FIG. 2

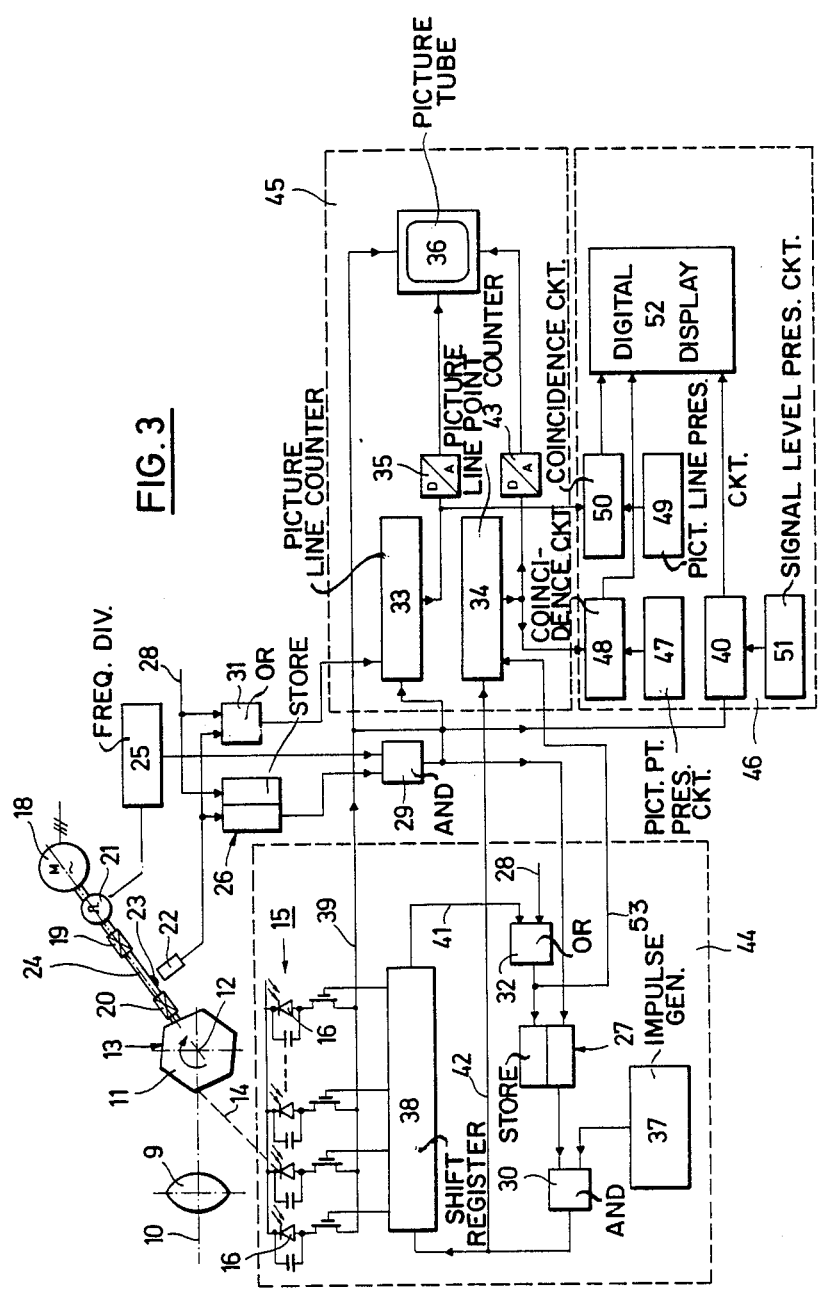

METHOD AND APPARATUS FOR MEASURING THE MONOCRYSTAL DIAMETER AND THE MELT LEVEL DURING CRUCIBLE DRAWING IN THE CZOCHRALSKI PROCESS

This application is a continuation of applications Ser. No. 724,493, filed Apr. 18, 1985, Ser. No. 535,546, filed Sept. 26, 1983, Ser. No. 414,988 filed Sept. 3, 1982 and Ser. No. 156,540 filed June 5, 1980 successively filed and abandoned thereupon.

BACKGROUND OF THE INVENTION

The invention relates to a method and an apparatus for measuring the diameter of a monocrystal while drawing it from a crucible by determining the brightness profile at the melt/monocrystal change-over point and determining the diameter therefrom.

Extensive automation of the crystal-drawing process, often called the Czochralski process, is desirable. An essential factor in the automation is control of the crystal diameter which is of decisive importance to the use of the end product. However, a method for controlling the diameter of the crystal requires a very precise method of measurement. Several proposals have already been described in the literature for this. However, the known methods are mainly limited to measuring and controlling the substantially cylindrical part of a crystal, i.e. that part used for providing the end products (semi-conductor discs). In terms of weight, this constitutes by far the greatest proportion of the drawn monocrystal.

However, the drawn monocrystal also comprises other parts of considerably varying diameters and change-over zones between the different diameters which have a decisive effect upon the quality of the end product. First, starting with what is known as a crystal nucleus, a "neck" is formed by drawing, this having a diameter of between approximately 2 and 6 mm. Adjoining this neck is a substantially conical change-over zone extending to the required crystal diameter which, in present-day production, is between approximately 60 and 120 mm. This diameter should be maintained over the greatest possible length of the monocrystal, which length is on the order of approximately 1000 mm or more. The cylindrical portion of the monocrystal should be followed by what is known as an end cone. Given the above-mentioned prerequisites, it is not only necessary to have a very precise diameter program dependent upon the length of the crystal, but also necessary to have a continuous comparison involving precise measured values to enable the diameter adjustment satisfactorily. In principle, the diameter of the crystal can be influenced mainly by two adjustable values, namely, the drawing speed and the temperature of the melt in the crucible (bath temperature). To deal with this situation, a linked adjusting circuit is generally provided whereby, firstly, deviation in diameter is eliminated by altering the drawing speed and, secondly, after a predetermined difference in speed is exceeded, adjustment of the bath temperature is carried out. However, in the absence of precise measuring methods, no readily usable proposals regarding the fully automatic control of such process have yet been put forward.

In the related field of zonal fusing and zonal drawing, British Patent Specifications Nos. 986,293 and 986,943 disclose the idea of detecting the molten zone between the two parts of the crystal horizontally from the side with a television camera, analyzing the individual lines of the video signal image for increased brightness, and in dependence upon that line of increased brightness having the greatest radial spacing from the axis of the crystal, adjusting the stretch/upset ratio of the two crystal parts and therefore the diameter.

In arriving at the measured value, the brightness of the light radiated from the molten zone against the dark background plays an important part. Direct application of this system to the crucible-drawing method is therefore not possible since, with the television camera taking pictures in a horizontal direction, the edge of the melting crucible gets in the way and masks the melt-/monocrystal change-over point within the crucible.

It is also known to use, in the crucible-drawing method, a television camera which, when taking pictures, is directed obliquely downwards toward the mouth of the crucible at a sharp angle to the axis of the crystal. However, measuring methods that make use of a television camera have the disadvantage of limited resolution because of non-linear deflection of the beam (in the television camera) such that errors of 1% of the measured diameter occur. By means of a very costly linearization system it has become possible to reduce the error to 0.5%. A disadvantage of this, however, is that the television camera tube cannot be replaced at the end of its service life without troublesome readjustment. Furthermore, the analysis of the signals resulting from taking a picture, that is recorded as a perspective view, is relatively complicated.

It is also known, from DE-PS No. 16 19 967, to aim a radiation detector obliquely downwards at a small surface area of the melt at the light-dark boundary of the diameter of the crystal. The radiation detector is then laterally adjusted with two micrometer screws arranged at right angles to each other and servo-motors according to a program of the desired variation in the diameter of the monocrystal. Although the accuracy in adjustment is relatively great, it is achieved only at the considerable expense of the precision mechanisms and control technique involved. Also in this system, the level of the bath of molten material in the crucible (which affects the crystal diameter as described above) has an effect which cannot be readily offset. This is due to the necessarily inclined viewing direction of the radiation detector. In addition, the field of view of this measuring arrangement is too limited.

The optical measuring method involving a viewing or picture-taking direction that is downwardly inclined at a sharp angle to the axis of the crystal based on the discovery that a clearly detectable light fringe is formed at the melt/monocrystal change-over point. The light fringe is attritible to the radiation of heat from the melt and possibly from the inner wall of the crucible. Because of the surface tension of the melt and the wetting of the crystal, there is formed at this point a kind of throat which, although not having a temperature higher than that of the surrounding zone, nevertheless acts as a concentrating reflector from the adjacent radiating surfaces. This is seen by the observer and/or the camera equipment as the above-mentioned annular and narrowly limited light fringe which, against the other surfaces, has a clearly detectable additional intensity.

SUMMARY OF THE INVENTION

Using the above-described effect, the invention has for its object the provision of a measuring method and a measuring apparatus of the initially described kind wherein a relatively large field of view is first determined by optical-mechanical means and therefore with great precision, and wherein a specific part of this field of view can be selected and used for determining the diameter.

This object is achieved, according to the invention, in that the melt/monocrystal change-over point is optically scanned as by a mirror rotating about a horizontal spindle (axis). The scanning optical beam reflected by the rotating mirror is passed to a row of photo-sensitive elements parallel with the spindle of the mirror, and their output signals are passed to an analyzing circuit for determining the brightness profile and, therefrom, the diameter.

The a rotating mirror, with which a picture-taking lens is very advantageously associated, continually scans the entire image field of the optical system and individual "lines" are selected from the row of photo-sensitive elements. Since the rotating mirror and the row of photo-sensitive elements can be manufactured with high precision, are located in fixed spatial relationship to each other, and generally do not need to be replaced even after long periods of time since they are not subjected to wear in the usual way, intensity signals which are extremely precisely associated with particular lines across the image field are obtained from the row of photo-sensitive elements. Accuracy of detection depends almost exclusively on the resolving power of the row of photo-sensitive elements which generally is in the form of what is called a "diode array". In the diode arrays at present available, 2048 photo diodes are provided over a length of 128 mm, i.e. for an image scale of 1:1, each diode corresponds to a length of 0.0625 mm. By altering the image scale, it is also possible to increase the resolving power of the diode array as regards the field of view. Furthermore, there is a trend to increase further the number of photodiodes per cm of length.

It is then possible to determine the brightness profile from the lines produced at intervals by the row of photo-sensitive elements in a computer, a numerical display means, or a picture screen. If the selected "line" corresponds to the diameter of the crystal, the row registers, because of the above-described effect, two brightness maxima which correspond to the diameter at the melt/monocrystal change-over zone. If this analysis is continually repeated, a continual diameter control is possible. A particular line can be picked up in a simple way by synchronization of the drive of the rotating mirror and retrieval from the row of photo-sensitive elements.

The synchronization may, however, be made variable. Also, it is possible pick up and analyze other parts of the image field and/or to cause the entire image field to be displayed so that a kind of photographic image of the crucible and the monocrystal results, such as can also be obtained, though without precise spatial correlation, by the operator looking into the crystal-drawing apparatus. Practically no limits are set to the type of analysis and use of the signals by the analyzing circuit.

It is also possible, with the stated measuring method, to monitor the quality of melting procedure applied to the initial material which is present in the form of granules or chippings, as well as to check the level of the molten material in the crucible. Deviations in the position of the level of the melt can be compared with a required value, and the difference can be signalled to a crucible-lifting mechanism which raises the crucible to an extent depending upon the consumption of its contents.

According to a further feature of the invention, a particularly advantageous measuring apparatus for carrying out the method of the invention is characterized by (a) a rotating mirror, the spindle of which is disposed horizontally, laterally of the axis of the crystal and above the level of the melt in such manner that planes normal to the mirror pass through the axis of the crystal and a radius of the crucible when said elements rotate, (b) a row of photo-sensitive elements, the common axis of which extends parallel with the axis of rotation of the rotating mirror and which are so directed that the image of the crystal, reflected by the mirror, and of the level of the melt surrounding the crystal sweeps the row transversely of its axis, (c) a scanning device for periodically and sequentially retrieving the measured signals from the row, (d) synchronizing means between the rotating mirror and the scanning device, which means permits retrieval of the measuring signals only at a predetermined angular position of the rotating mirror, (e) an analyzing circuit for the measuring signals from the row, and (f) a display device for displaying the output signals from the analyzing circuit.

BRIEF DESCRIPTION OF THE DRAWINGS

An example of the construction of the apparatus of the invention and its mode of operation will now be described in greater detail by reference to the drawings wherein:

FIG. 1 is a perspective illustration of the main parts of a crucible drawing apparatus and a preferred embodiment of an optical portion of the crystal diameter measuring apparatus including a rotating mirror and a row of photosensitive elements, FIG. 2 is a plot of the signal from the row of photo-sensitive elements for a picture line extending through the diameter of the crystal, and FIG. 3 is a schematic of the entire measuring arrangement.

DETAILED DESCRIPTION OF THE INVENTION

As shown in FIG. 1, a heatable crucible 1 forms part of the crucible drawing apparatus in accordance with the Czochralsky system. No other parts of the apparatus are shown, but it includes a pressure-tight chamber, means for establishing a particular atmosphere in this chamber, a device for heating and moving the crucible, and a rotatable and axially displaceable holding rod for the monocrystal 2 that is being formed. The monocrystal is drawn from a molten mass (melt) 3 of semi-conductor material in the crucible 1. By suitably varying the drawing parameters during the production process, first a neck 4 is drawn, then a conical change-over zone 5 and finally the substantially cylindrical portion 6 of the monocrystal. At the melt/monocrystal change-over zone is a molten throat 7 which, as a result of the effect described above, produces a bright light fringe disposed at the same place. The monocrystal 2 has a vertical axis 8 about which the crucible 1 is also disposed.

On one side of the axis 8 of the crystal, above the level of the molten material 3 and at a sharp angle to the axis 8 of the crystal is an optical system (lens) 9 the control axis 10 of which is substantially directed onto the (imagined) point of intersection of the level of the molten material and the axis 8 of the crystal. Arranged to the rear of the optical system along the optical axis 10 is a rotating mirror 11 having a horizontal axis 12 of rotation. The rotating mirror 11 may have any number of mirror elements 13. Particularly expedient, however, is a six-sided prism having planar mirror elements as shown in FIG. 1. The axis 12 of rotation is arranged to the side of the axis 8 of the crystal and above the level of the molten material in such manner that planes normal to the mirror elements 13 pass through the axis 8 of the crystal and through a radius of the crucible to scan the monocrystal 2, the melt 3, and the crucible 1 with the mirror elements in a manner corresponding roughly to that shown in FIG. 1, but from a somewhat higher point. The scanned images are reflected from each of the mirror elements 13 in the direction of ray 14, and because of the rotation of the rotating mirror 11, the images sweep a row 15 of photo-sensitive elements 16. In the relative positions of the parts as shown in FIG. 1, there is reproduced on the row of elements 15 that picture line that corresponds to the view onto a diameter of the crystal that passes through the melt/monocrystal change-over point. The light-sensitive elements 16, which may be photo-cells, photo-diodes, photo-resistors, etc., produce responses which correspond to the position of the particular photo-sensitive element and to the intensity of the light beam received which, here, is the brightness profile of the diameter at the melt/monocrystal change-over point. If the photo-sensitive elements 16 are now interrogated in succession, the relative intensities illustrated by the plot in FIG. 2 occur. The curve 17 representing the intensity has two pronounced maxima $M_1$ and $M_2$ which correspond to the position of the throat 7 at diametrically opposite points.

Bearing in mind the scale of FIGS. 1 and 2 and the arrangement and the spatial position of the individual photo-sensitive elements 16, the distance between the maxima $M_1$ and $M_2$ constitute a measure of the diameter D of the mono-crystal 2. This, possibly after suitable calibration of the apparatus, can be indicated by means of an analyzing circuit, the details of which will now be described.

The elements shown in FIG. 1 are represented diagrammatically in the left top corner of FIG. 3; the reference numerals used for the elements shown in FIG. 1 are also used for corresponding elements in FIG. 3. The rotating mirror is driven by a step-by-step or synchronous motor 18 through two intermediate gears 19 and 20. Each angular position of the mirror is picked up by an impulse generator 21. Since a digital method for determining the position of the rotating mirror 11 is here used, an orientation impulse generator 22 in the form of a contact-less limit switch is provided for fixing the zero point. This limit switch is so actuated by means of cam 23 on the drive shaft 24 that an orientation impulse is produced for each edge between adjoining mirror elements 13.

The impulses from the impulse generator 21 are converted by way of a frequency divider 25 so that for each mirror element 13 there is produced a sepcific number of impulses, for example 1000, which correspond to the required number of picture lines.

An impulse release store 26 and a line cycle release store 27 such as set-reset flip-flops are brought by a start-control impulse supplied through a line 28 into a condition such that the output signals from the impulse release store 26 and the line cycle release store 27 block AND-gate circuits 29 and 30. Also present are OR-gate circuits 31 and 32, the outputs of which are passed to a picture-line counter 33 and a picture-line point counter 34 so that these are initially set to zero by the same start-control impulse on line 28.

The orientation impulse generator 22 is connected to the impulse release store 26 in such a manner that the latter is brought, by an impulse, into a condition such that the impulses from the frequency divider 25 are able to pass through the gate circuit 29. The output of the latter is connected to the picture-line counter 33 and the line cycle release store 27. Since each impulse from the frequency divider 25 corresponds to a picture line, the picture-line counter 33 indicates how many picture lines have been analyzed (as later described). Connected downstream of the picture-line counter 33 is a digital-analogue transducer 35, the output of which is connected to the Y-axis deflection system of a picture tube 36.

An impulse generator 37 for scanning the picture lines is connected to the gate circuit 30 along with the line cycle release store 27. The latter is so set by the line impulses passing through the gate circuit 29, that the gate circuit 30 releases the impulses of generator 37 for scanning the lines. The gate circuit 30 is connected to a shift register 38 which sequentially enables outputs from the photo-sensitive elements 16 to pass the measured values of the photo-sensitive elements 16 to the video output line 39. The video output line 39 is connected to the input of a (not illustrated) device for controlling the brightness of the picture tube 36, as well as to a signal-level analyzing circuit 40. The frequency of the impulse generator 37 is such that before the next line impulse occurs at the input of the line cycle release store 27, the shift register will be certain to have completed an interrogation cycle. This is confirmed by an impulse which signals the "line scanned" condition. This impulse is passed through a line 41 to the second input of the OR element 32 which brings the line cycle release store 27 into the block condition. Only when a new line impulse occurs does release take place by way of the line cycle release store 27 so that the next line can be scanned. The occurrence of the line impulse is an indication that the prism mirror 11 has turned through a particular angle of rotation.

The line-scanning impulses passing to the gate circuit 30, apart from reaching the input of the shift register 38 by way of line 42, also pass to the input of the picture line point counter 34. Connected downstream of this counter is a digital-analogue transducer 43 by means of which the contents of the picture line point counter 34 is passed to the X-axis deflection system of the picture tube 36.

After the "line scanned" impulse has occurred at the output of the OR gate 32, the line picture point counter 34 is set to zero by way of line 53. This occurs in a similar manner with the picture line counter 33 which is returned to zero by an impulse produced by the orientation impulse generator 22, after the entire picture has been scanned.

The elements illustrated within the block surrounded by broken lines in the left-hand half of FIG. 3 are designated as the line scanner circuit 44. The elements illustrated within the upper block surrounded by broken lines in the right-hand half form an analogue picture-analyzing circuit 45. For the purpose of digital picture analysis, the apparatus also incorporates a digital picture-analyzing circuit 46, the details of which will now be described.

The digital picture-analysis circuit 46 comprises a picture-point preselection circuit 47 and an associated downstream coincidence circuit 48, by means of which circuit each picture point can be individually selected. By means of a picture-line preselection circuit 49 and an associated downstream coincidence circuit 50, each individual picture line can be selected in a similar manner. Furthermore, by means of a signal-level preselection circuit 51, the video signal leaving the row of photo-sensitive elements by way of the video output line 39 can be analyzed by way of the signal-level analyzing circuit 40 in accordance with various criteria relating to the magnitude of the signal. The output signals from the signal level analyzing circuit 40, the coincidence circuit 48 and the coincidence circuit 50 are passed to a digital display device 52.

In the example described and illustrated, the synchronization means consists of the above described impulse generator 21, orientation impulse generator/cam 22/23, frequency divider 25, impulse release store 26, line cycle release store 27, and gate circuits 29, 30.

The measuring method in accordance with the invention can thus be designed as a control method by passing the measuring signal or display signal, characterizing the dimension of the crystal, to setting members after comparison with a required diameter value, which setting members influence at least one of the initially mentioned drawing parameters in the appropriate manner. Such setting members form part of the prior art and therefore do not require description. The same system applies as regards the signal for the level of the melt.

The "reference point" can be determined in various ways. A signal for determining the location of the axis of the crystal may be involved, whereby the radius is determined up to the maximum brightness. However, the reference point may also be one of the maxima $M_1$ and $M_2$ (FIG. 2), whereby the spacing to the other maximum defines the diameter of the crystal. If the reference point is applied to an analogue indicator at the beginning of its scale, the deflection gives the radius or the diameter of the monocrystal. In the case of a digital display e.g. by means of figures, the reference point is the initial magnitude (not illustrated) of the measured value, i.e. only the distance from the reference point is shown each time.

What is claimed is:

1. A method of measuring the diameter of monocrystals and controlling the melt level during crucible drawing of the Czochralski type wherein the brightness profile at the melt/monocrystal change-over point is determined by an optical system having an observation axis under an acute angle to an axis of the monocrystal and the spatial position of the brightness profile in relation to a reference point on a display device is indicated, said method comprising the steps of:
optically scanning the melt-monocrystal change-over point by rotating a mirror about a horizontal axis; applying the optical beam reflected by the rotating mirror to a row of photo-sensitive elements in parallel with the horizontal axis; periodically retrieving the measured values from the row of photo-sensitive elements in synchronism with the rotation of the mirror thereby to produce a plurality of scan lines; analyzing the outputs corresponding to the brightness profile in each scan line to determine intensity maxima of the scan line that corresponds to the direction of view onto a diameter of the monocrystal that passes through the melt-monocrystal change-over point, the distance between said intensity maxima in the selected scan line representing the said crystal diameter; applying the analyzed output signals for at least said selected scan line to the display device; and controlling the level of the molten material in the crucible by comparing the position of the selected scan line with a predetermined position and providing a signal proportional to the difference to a crucible-lifting mechanism for reducing said difference.

2. A method of controlling the melt level and measuring the diameter of the monocrystal being drawn vertically from the melt in a Czochralski type crystal drawing process in a crucible wherein the brightness profile at the melt/monocrystal change-over point is observed, the position of the melt/monocrystal change-over point changing as the monocrystal is drawn from the melt, and the spatial position of maxima in the brightness profile is determined in relation to a reference point for measuring the diameter of the monocrystal indicated thereby, said method comprising the steps of:
optically scanning at least one of the monocrystal and melt at least to the melt/monocrystal change-over points;
positioning only one row of photo-sensitive elements horizontally to receive the optical scanning;
intermittently obtaining the response of the row of photo-sensitive elements to the optical scanning, thereby producing a plurality of scan lines;
processing the responses of the row of photo-sensitive elements in each scan line to identify a scan line corresponding to the direction of view onto a diameter of the monocrystal that passes through the melt/monocrystal change-over point, and the responses of the individual photo-sensitive elements in the identified scan line of the row to identify maxima therein; and
controlling the level of the molten material in the crucible by comparing the position of the selected scan line with a predetermined position and providing a signal proportional to the difference to a crucible-lifting mechanism for reducing said difference;
whereby the spatial position of the individual photosensitive elements producing the maxima in the identified scan line indicates the diameter at the melt/monocrystal change-over point without variation from the position of melt/monocrystal change-over point and whereby the position of the selected scan line indicates the level of the molten material.

3. The method of claim 2, wherein the optically scanning comprises rotating a mirror about a horizontal axis, positioning the row of photo-sensitive elements comprises fixedly positioning the same to receive optically-scanning reflections from the mirror, and intermittently obtaining the responses of the row of photo-sensitive elements comprises intermittently obtaining the response of the same to the reflections.

4. The method of claim 3, wherein the optically scanning comprises rotating a mirror having at least one planar reflection surface.

5. The method of claim 4, wherein the optically scanning comprises rotating a mirror having prismatically-arranged planar reflection surfaces.

6. The method of claim 4, wherein intermittently obtaining the responses of the row of photo-sensitive elements comprises identifying each rotation of the planar reflection surface and obtaining sufficient intermittant responses from the row of photo-sensitive elements after each rotation that one of the responses from the reflection from the mirror onto the row of photo-sensitive elements corresponds to the brightness profile.

7. The method of claim 6, wherein intermittently obtaining the responses of the row of photo-sensitive elements comprises periodically obtaining the same number of responses after each identified rotation of the planar reflection surface for synchronism therewith and processing the responses comprises displaying each of the periodic, synchronized responses of the row of photo-sensitive elements as successive lines of a picture of the scan thus obtained, whereby the brightness of the brightness profile identifies the same in the picture and the position thereof in the picture corresponds to the position of the melt/monocrystal change-over point.

8. The method of claim 6, wherein processing the responses comprises selecting those intermittent responses which exceed a preselected level.

9. The method of claim 8, wherein processing the responses additionally comprises preselecting individual ones of the intermittent responses, whereby the one corresponding to the brightness profile may be selected.

10. The method of claim 9, wherein processing the responses additionally comprises preselecting the individual photo-sensitive elements of the row from which responses are obtained, whereby the position of the maxima of the brightness profile is obtained from the response maxima of the corresponding individual photo-sensitive elements.

11. Apparatus for controlling the melt level and measuring the diameter of a monocrystal being drawn vertically from the melt in a crucible using the Czochralski process, wherein the brightness profile at the melt/monocrystal change-over point is observed, the position of the melt/monocrystal change-over point changing as the monocrystal is drawn from the melt, and wherein the spatial position of maxima in the brightness profile is determined for measuring the diameter of the monocrystal indicated thereby, said apparatus comprising:

only one horizontal row of photo-sensitive elements;
means for directing an optical scan of at least the monocrystal change-over point onto the row of photo-sensitive elements;
means for intermittently obtaining the responses of the row of photo-sensitive elements to the optical scan, thereby producing a plurality of scan lines;
means for processing the response of the row of photo-sensitive elements to identify a scan line corresponding to the direction of view onto a diameter of the monocrystal that passes through the melt/monocrystal change-over point and the responses of the individual photo-sensitive elements in the identified scan line of the row to identify intensity maxima therein; and
means for controlling the level of the molten material in the crucible by comparing the position of the identified scan line with a predetermined position and providing a signal proportional to the difference to a crucible-lifting mechanism for reducing said difference;
whereby the spatial position of the individual photo-sensitive elements producing the maxima in the identified scan line indicates the diameter at the melt-monocrystal change-over point without variation from the position of melt/monocrystal change-over point and whereby the position of the selected scan line indicates the level of the molten material.

12. Apparatus as in claim 11, wherein the row of photo-sensitive elements is fixedly positioned, and the means for directing the optical scan comprises at least one planar mirror and means rotating it about a horizontal axis for reflecting the optical scan onto the row of photo-sensitive elements.

13. Apparatus as in claim 12, wherein the means for processing the responses comprises means for displaying the response of at least preselected ones of the individual photo-sensitive elements in at least a preselected one of the intermittent responses,
whereby the intermittent response corresponding to the brightness profile may be identified from the response signal level and the spatial position of maxima therein may be identified from the individual photo-sensitive elements corresponding to the response-maxima.

14. Apparatus as in claim 13, additionally comprising means for synchronizing the means for intermittently obtaining the responses to the means for rotating the mirror and wherein the means for processing the responses comprises means for displaying each intermittent response in vertical progression and horizontal spatial positions corresponding to the individual photo-sensitive elements producing the same, whereby a steady line-by-line picture of the optical scan is obtained from which the position of the brightness profile and its maxima are obtained.

* * * * *